United States Patent [19]
Bill et al.

[11] Patent Number: 6,088,287
[45] Date of Patent: Jul. 11, 2000

[54] FLASH MEMORY ARCHITECTURE EMPLOYING THREE LAYER METAL INTERCONNECT FOR WORD LINE DECODING

[75] Inventors: Colin S. Bill, Cupertino; Jonathan Shi-Chang Su, Mountain View; Ravi P. Gutala, Milpitas, all of Calif.

[73] Assignee: Advanced Micro Devices, Inc., Sunnyvale, Calif.

[21] Appl. No.: 09/379,479

[22] Filed: Aug. 23, 1999

[51] Int. Cl.$^7$ ....................................................... G11C 8/10
[52] U.S. Cl. ............................. 365/230.06; 365/230.03; 365/63
[58] Field of Search ..................... 365/230.06, 230.03, 365/63

[56] References Cited

U.S. PATENT DOCUMENTS 5,410,508  4/1995  McLaury ............................ 365/189.09
5,977,799  11/1999  Kai et al. ................................. 326/108
5,978,277  11/1999  Hsu et al. ............................ 365/185.29

Primary Examiner—Andrew Q. Tran
Attorney, Agent, or Firm—Brinks Hofer Gilson & Lione

[57] ABSTRACT

The present invention discloses a memory wordline decoder that includes a plurality of pre-decoded address lines that are electrically connected with a global x-decoder. A sub x-decoder is electrically connected with the global x-decoder for receiving electrical control signals from the global x-decoder. A memory sector is electrically connected with the sub x-decoder. The global x-decoder selectively controls the sub x-decoder to select a plurality of wordlines in the memory sector. A vertical x-decoder is electrically connected with the global x-decoder and the sub x-decoder. The vertical x-decoder is used to select a predetermined wordline by the global x-decoder during operation.

17 Claims, 4 Drawing Sheets

FLASH MEMORY ARCHITECTURE EMPLOYING THREE LAYER METAL INTERCONNECT FOR WORD LINE DECODING

FIELD OF INVENTION

The present invention relates generally to non-volatile memory devices and, more particularly, to methods and systems for decoding wordlines in flash electrically erasable programmable read-only memory (EEPROM) devices.

BACKGROUND OF THE INVENTION

Flash memories are popular memory storage devices because they store information in the absence of continuous power and are capable of being constructed in a very compact form. Flash memory is typically constructed by fabricating a plurality of floating-gate transistors in a silicon substrate. A floating-gate transistor is capable of storing electrical charge either on a separate gate electrode, known as a floating gate, or in a dielectric layer underlying a control-gate electrode. Generally speaking, data is stored in a non-volatile memory device by the storage of an electrical charge in the floating gate.

In a flash EEPROM device, electrons are transferred to the floating-gate electrode through a thin dielectric layer, known as a tunnel-oxide layer, located between the floating-gate electrode and an underlying substrate. Typically, the electron transfer is carried out by channel hot electron ("CHE") injection or Fowler-Nordheim tunneling. In either electron transfer mechanism, a voltage is coupled to the floating-gate electrode by a control-gate electrode. The control-gate electrode is capacitively coupled to the floating-gate electrode, such that a voltage applied to the control-gate electrode is coupled to the floating-gate electrode. In one type of device, the control-gate electrode is a polycrystalline silicon-gate electrode overlying the floating-gate electrode and separated therefrom by a dielectric layer. In another type of device, the floating-gate electrode is a doped region in the semiconductor substrate.

Flash memory devices are formed by rows and columns of flash transistors, with each transistor being referred to as a cell. A wordline decoder provides operational voltages to rows of transistors in each sector of the memory device and is typically connected with the gate of each transistor in the sector. A bit line decoder provides operational voltages to columns of transistors and is typically connected to the drains of the transistors in each column. Generally, the sources of the transistors are coupled to a common sourceline and are controlled by a sourceline controller.

A cell is typically programmed by applying a predetermined voltage to the control gate, a second predetermined voltage to the drain, and grounding the source. This causes channel hot electrons to be injected from the drain depletion region into the floating gate. Cells are typically read by applying a predetermined voltage to the control gate, a second predetermined voltage to the bit line, to which the drain is connected, grounding the source, and then sensing the bit line current. If the cell is programmed and the threshold voltage is relatively high, the bit line current will be zero or relatively low. If the cell is not programmed or erased, the threshold voltage will be relatively low, the control-gate voltage will enhance the channel and the bit line current will be relatively high.

A cell can be erased several ways in a flash memory device. In one arrangement, a cell is erased by applying a predetermined voltage to the source, grounding the control gate and allowing the drain to float. This causes the electrons that were injected into the floating gate during programming to be removed by Fowler-Nordheim tunneling from the floating gate through the thin tunnel oxide layer to the source.

A known problem with decoding architecture is that one wordline decoder, and sometimes two wordline decoders, are used to perform the decoding that selects rows of transistors in each sector. These prior art wordline decoding architectures have all of the decoding logic situated at each stage in the wordline decoder. As such, there is no partial decoding in the core area, which contributes to a large wordline decoder size. Because of the large physical size of the wordline decoder, space is wasted on the silicon substrate or extra space is required which increases the size of the memory device.

Known prior art memory wordline decoding architectures use two layers of metal to interconnect the wordline decoder with the cells in the memory device. Due to the very small size of the transistors, the metal lines that are used to connect the transistors with the decoders are extremely difficult to manufacture without experiencing yield loss. This is because the metal lines that connect the various electrical components together are deposited very close together, which leads to shorting and noise problems.

To that end, a need exists for memory devices with an improved method and system of decoding memory wordlines that does not require as much physical space on the substrate and yet does not increase yield loss during manufacturing.

SUMMARY OF THE INVENTION

The present invention discloses a flash memory wordline decoder architecture that overcomes the problems associated with prior art wordline decoder architectures. The preferred flash memory includes a plurality of sectors that store information, wherein each sector is divided into a plurality of half sectors. As with traditional memory sectors, each half sector is constructed with rows and columns of flash transistors that make up a flash transistor array. The preferred flash memory further includes a plurality of predecoded address lines that are electrically connected with at least one global x-decoder. In addition, the flash memory includes at least one sub x-decoder and at least one vertical x-decoder that are electrically connected with a respective global x-decoder in a row of sectors. The sub x-decoders and the vertical x-decoders are positioned between each half sector in the flash memory.

During operation, the global x-decoder partially decodes information contained in the pre-decoded address lines, then uses the sub x-decoders and the vertical x-decoders to complete the decoding operation that selects a predetermined wordline in the appropriate sector. Each global x-decoder in the flash memory includes at least one global wordline output, at least one second global wordline output and a plurality of vertical address outputs. The first global wordline output and the second global wordline output are electrically connected with respective sub x-decoders located in a particular row of sectors. The vertical address outputs of the global x-decoder are electrically connected with each vertical x-decoder in a particular row of sectors.

Each sub x-decoder includes a plurality of wordline selector circuits that are electrically connected with the global x-decoder and the vertical x-decoder that is associated with a particular sector. In particular, the first global wordline output, the second global wordline output and a predetermined vertical wordline output are electrically connected with each respective wordline selector circuit. The wordline selector circuits use the partially decoded information from the global x-decoder and the vertical x-decoder to select a predetermined wordline in a sector. The present invention provides advantages over prior art wordline decoding methods and systems by decreasing the size of the wordline decoder architecture by as much as 75 percent.

In the preferred embodiment of the present invention, the first global wordline output and the second global wordline output are deposited as a third metal layer on the flash memory. As known in the art, one or more layers of conducting metal are deposited on a substrate to interconnect the circuit components of the device with one another to complete the current path. This process is commonly referred to as metallization in the semiconductor industry. In the present invention, a first metal layer and a second metal layer are used to interconnect the various components of the flash memory. As previously set forth, the third metal layer is used to interconnect the first global wordline output and the second global wordline output of the global x-decoder with each respective sub x-decoder in the flash memory.

Presently known prior art memory decoding architectures use first and second metal layers to interconnect the various components of the memory device, such as connecting the wordline decoders with each sector. In the memory cell array, the bit lines use the first and second metal interconnection layers. Since the present invention uses the first global wordline outputs and the second global wordline outputs for partial decoding, it is only necessary to have two metal lines for a predetermined number of wordlines per sector. This allows the third metal layer in the core area of the flash memory to have metal lines that are widely spaced, at least six $\mu$m in the preferred embodiment, relative to prior art methods that require a metal line for every wordline.

Using the third metal layer in the flash memory results in no penalty in terms of yield loss due to metal shorts that occur during manufacturing. In prior art memory devices, the metal lines that connect the wordline decoder with each wordline in a sector are spaced approximately 0.7 $\mu$m apart. As readily apparent to those skilled in the art, from a manufacturing standpoint, the present invention provides benefits over prior art methods by not increasing yield losses during manufacturing that occur because of shorts in the metal lines that are used to connect the wordline decoders with the wordlines in each sector.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the invention are set forth below with reference to specific configurations, and those skilled in the art would recognize that various changes and modifications can be made on the specific configurations while remaining within the scope of the claims. The invention may be used with any type of memory device; however, the preferred embodiment of the invention is designed for a flash memory. The invention may also be used with flash memory devices that use Fowler-Nordheim (F-N) and channel hot electron (CHE) injection for erase and programming of the cells in the flash memory.

All electrical parameters are given by example only and can be modified to be used with various memory devices using other electrical parameters. For example, in the preferred embodiment, a supply voltage (Vcc) is considered as 3.3 V, but could alternatively be 5 V, 1.8 V or some other supply voltage. If a different supply voltage is chosen, the various operational levels would be modified to accommodate the different supply voltage, as known in the art.

Figure 1:
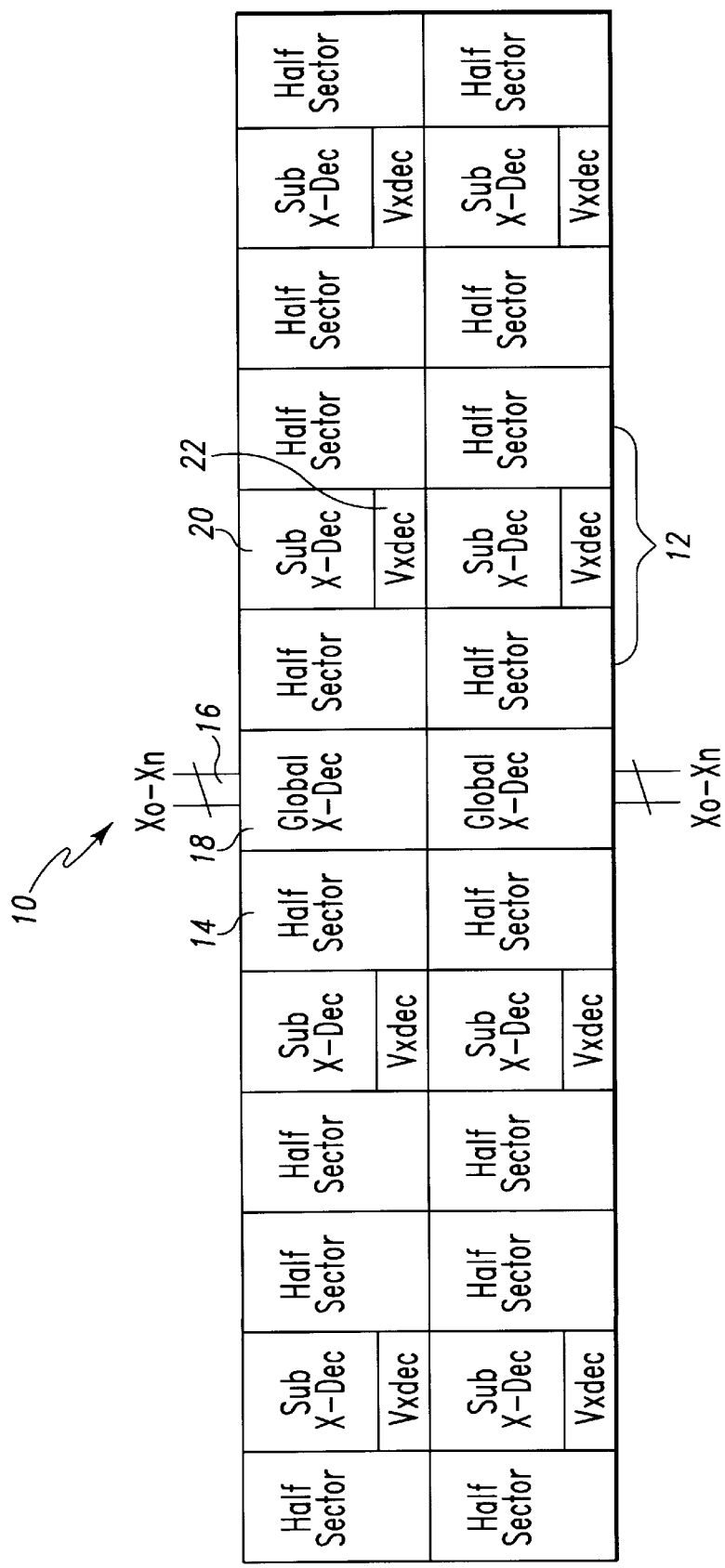
FIG. 1 represents a block diagram of a portion of a preferred flash memory incorporating the presently disclosed wordline decoding architecture.

FIG. 1 illustrates a portion of a preferred flash memory 10 incorporating an embodiment of the present invention. The flash memory 10 includes a plurality of sectors 12 that store information; and, in the preferred embodiment of the invention, the sectors 12 are divided into a plurality of half sectors 14. As in traditional memory sectors, each half sector 14 is constructed with rows and columns of flash transistors that make up a flash transistor array. The particular transistor array used may be constructed using several transistor configurations known in the art, such as NOR, DINOR, NAND and AND configurations, for example.

The preferred flash memory 10 further includes a plurality of pre-decoded address lines Xo–Xn 16 that are electrically connected with at least one global x-decoder 18. In addition, the flash memory 10 includes at least one sub x-decoder 20 and at least one vertical x-decoder 22, which are both electrically connected with a respective global x-decoder 18 in a row of sectors 12. As illustrated, the sub x-decoders 20 and the vertical x-decoders 22 are positioned between each half sector 14 in a sector 12 of the flash memory 10. During operation, the global x-decoder 18 partially decodes information contained in the pre-decoded address lines Xo–Xn 16, then uses a predetermined sub x-decoder 20 and vertical x-decoder 22 to complete the decoding operation that selects a predetermined wordline in the appropriate sector 12.

As known in the art, a wordline refers to a particular row of flash transistors in the array of transistors that is contained in each sector 12. In the preferred embodiment of the invention, there are 512 wordlines in each sector 12, and 512 bit lines in each half sector 14. During operation, each global x-decoder 18 can enable a group of 16 wordlines in a sector 12 with the sub x-decoder 20, but may be designed to enable more wordlines in other embodiments. Once the global x-decoder 18 selects the group of 16 wordlines, the vertical x-decoder 22 is used to select a specific wordline of the group of 16 enabled by the global x-decoder 18. The present decoder architecture was designed for 16-megabit flash memory chips, but may be expanded to accommodate 64 and 128 megabit flash memory chips as well. Those skilled in the art would recognize that the present invention may be used in various size memory chips.

Figure 2:
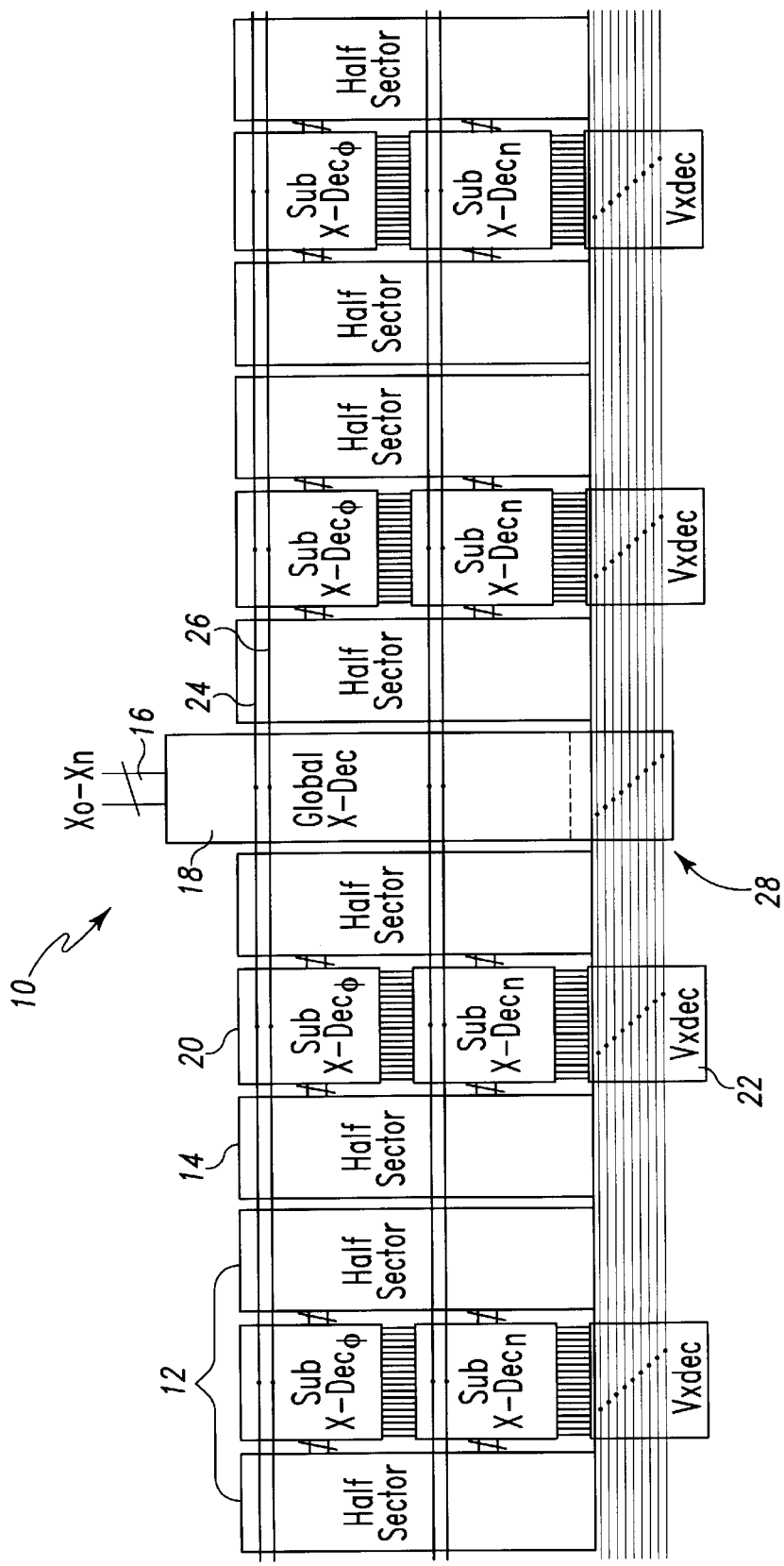
FIG. 2 represents a block diagram of a row of the preferred flash memory illustrated in FIG. 1.

FIG. 2 illustrates one row of the flash memory 10 depicted in FIG. 1, which incorporates an embodiment of the present invention. As previously set forth, the predecoded address lines Xo–Xn 16 are used by the flash memory 10 to provide a plurality of electrical signals to the global x-decoder 18 that correspond to a predetermined wordline in a particular sector 12. After the global x-decoder 18 receives an electrical signal from the pre-decoded address lines Xo–Xn 16, the appropriate wordline is selected using a respective sub x-decoder 20 and a respective vertical x-decoder 22.

Each global x-decoder 18 in the flash memory 10 includes at least one global wordline output 24, at least one second global wordline output 26 and a plurality of vertical address outputs 28. The first global wordline output 24 and the second global wordline output 26 are electrically connected with each sub x-decoder 20 in a particular row of sectors 12, as illustrated in FIG. 2. The vertical address outputs 32 are electrically connected with each vertical x-decoder 22 in a particular row of sectors 12.

The global x-decoder 18 and the vertical x-decoder 22 may be designed using decoder architecture known in the art. As known in the art, a fundamental component of any memory device is the decoder circuits. In general, decoder circuits output a unique signal if and only if all of the bits of an input correspond to a predetermined set of values. Thus, decoder circuits for a memory device are used to enable a particular wordline in a matrix of memory cells if an input memory address matches the predetermined address of a line of memory cells to which the decoder is connected. The present invention provides advantages over prior methods of decoding by providing partial decoding at different stages throughout the memory cell core array.

Figure 3:
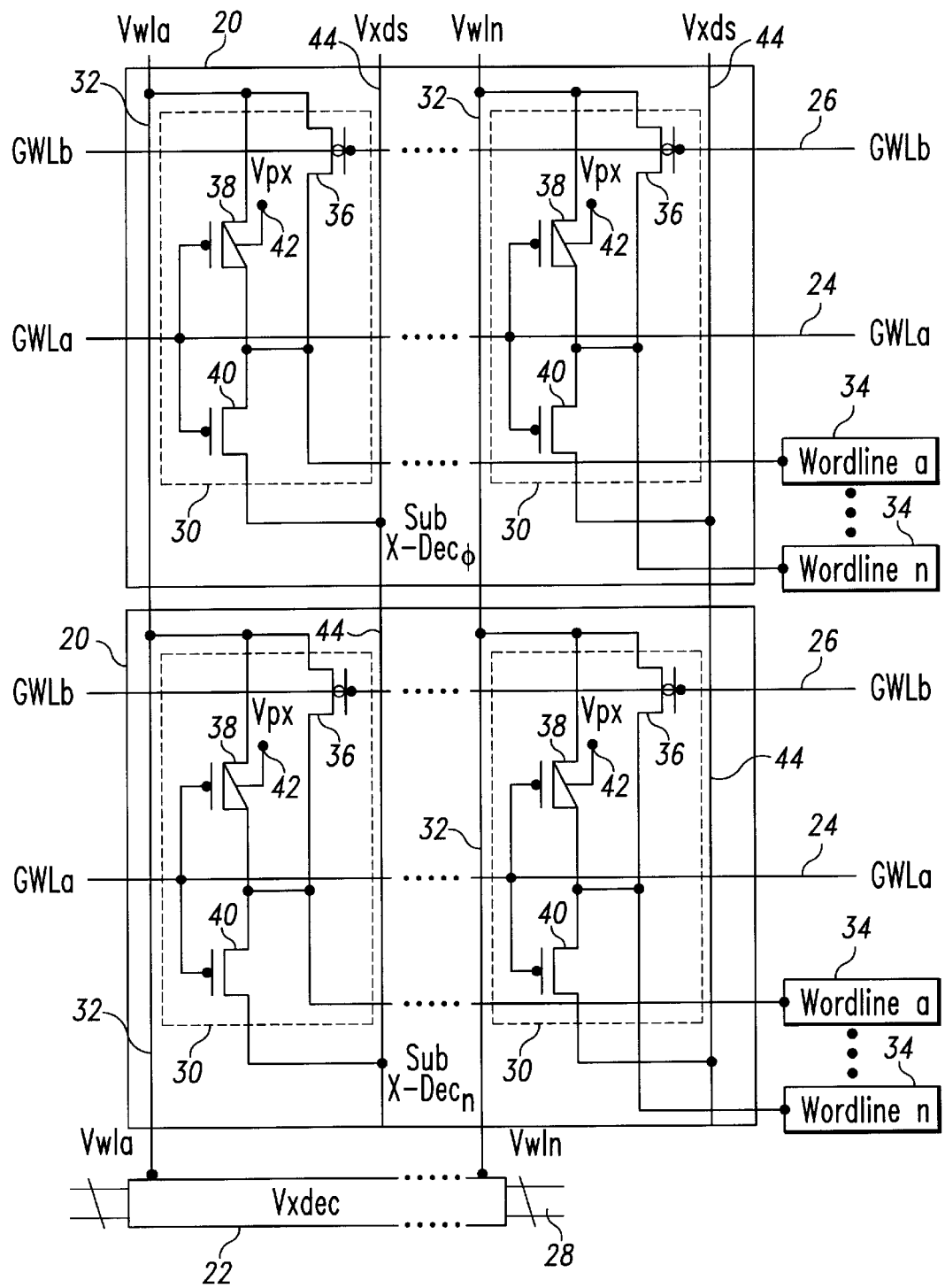
FIG. 3 is a circuit schematic of the preferred sub x-decoder of the present invention.

FIG. 3 illustrates a preferred embodiment of two sub x-decoders 20 that are illustrated in FIGS. 1 and 2. In the preferred embodiment, each sub x-decoder 20 includes a plurality of wordline selector circuits 30 that are electrically connected with the global x-decoder 18 and the vertical x-decoder 22 that is associated with a respective sector 12.

In particular, the first global wordline output 24, the second global wordline output 26 and a predetermined vertical wordline output $Vwl_o$–$Vwl_n$ 32 from the vertical x-decoder 22 are electrically connected with each respective wordline selector circuit 30. The wordline selector circuits 30 use the partially decoded information from the global x-decoder 18 and the vertical x-decoder 22 to select a predetermined wordline 34 in a sector 12.

The preferred wordline selector circuit 30 comprises a low-threshold n-channel transistor 36, a p-channel transistor 38 and an n-channel enhancement transistor 40. As illustrated in FIG. 3, the drain of low-threshold n-channel transistor 36 is electrically connected with a respective vertical wordline output $Vwl_o$–$Vwl_n$ 32 from the vertical x-decoder 22. The source of low-threshold n-channel transistor 36 is electrically connected with a predetermined wordline 34 of the sector 12. Further, the gate of low-threshold n-channel transistor 36 is electrically connected with the second global wordline output 26 of the global x-decoder 18.

As further illustrated in FIG. 3, the source of p-channel transistor 38 is electrically connected with the respective vertical wordline output $Vwl_o$–$Vwl_n$ 32. The gate of p-channel transistor 38 is electrically connected with the first global wordline output 24 of the global x-decoder 18 and the drain is electrically connected with a respective wordline 34 of the sector 12. In addition, the n-well of p-channel transistor 38 is electrically connected with a first voltage node (Vpx) 42. The first voltage node (Vpx) 42 is used to prevent forward bias of the p-channel transistor 38 drain and source junction during operation. The drain of the n-channel enhancement transistor 40 is electrically connected with the respective wordline 34 of the sector 12. The gate of the n-channel enhancement transistor 40 is electrically connected with the first global wordline output 24 of the global x-decoder 18 and the source is electrically connected with a second voltage node (Vxds) 44.

Although not illustrated in FIG. 3, in the preferred embodiment of the present invention there are 16 wordlines assigned to each sub x-decoder 20. As such, there are 16 wordline selector circuits 30 contained in each sub x-decoder 20 in the preferred embodiment. Likewise, as illustrated in FIG. 3, each vertical x-decoder 22 has 16 vertical wordline outputs $Vwl_o$–$Vwl_n$ 32 that are individually connected with a respective wordline selector circuit 30. During operation, the first global wordline output 24 and the second global wordline output 26 of the global x-decoder 18 enable 16 rows of wordlines 34 in the selected sector 12. The actual wordline 34 that is selected from the 16 wordlines 34 selected by the global x-decoder 18 is chosen with the vertical wordline outputs $Vwl_o$–$Vwl_n$ 32 from the vertical x-decoder 22. Thus, the particular wordline 34 selected is chosen by the combination of the first global wordline output 24, the second global wordline output 26 and a respective vertical wordline output $Vwl_o$–$Vwl_n$ 32.

As previously set forth, in the preferred embodiment of the invention, there are 512 wordlines per sector 12. Since each sub x-decoder 20 is designed to handle 16 wordlines 34, this means that 32 sub x-decoders 20 are used in each sector 12. Although not illustrated in FIGS. 2 and 3, this also means that there are 32 first global wordline outputs 24 and second global wordline outputs 26 coming from each global x-decoder 18. Those skilled in the art would recognize that the above-referenced configuration is by way of example only and should not be construed as a limitation of the present invention. The exact configuration used will vary depending on the size of the flash memory 10.

The wordline selector circuits 30 are designed to handle all aspects of the sector 12 decoding operations, such as read, program, erase and all test functions. As it relates to the preferred embodiment set forth above, in read mode, the first global wordline output 24 is set active low so that one of the 32 first global wordlines 24 is active low and the remaining 31 first global wordline outputs 24 are boosted above Vcc to approximately 4.5 V. The second global wordline 26 is set at Vcc and the non-selected second global wordlines 26 are set to 0 V. The selected vertical wordline output $Vwl_o$–$Vwl_n$ 32 is set at 4.5 V and the second voltage node (Vxds) 44 is set to 0 V by a voltage circuit (not shown). Those skilled in the art would recognize that the operational voltages supplied during operation are generated by various voltage generation circuits that are beyond the scope of the present invention.

In the program mode, the selected first global wordline output 24 is set to 0 V and the non-selected second global wordline outputs 24 are set to Vpp (8.5 V). The selected second global wordline output 26 is set to Vcc and the non-selected second global wordline outputs 26 are set to 0 V. The selected vertical wordline output $Vwl_o$–$Vwl_n$ 32 is set to Vpp and the second voltage node (Vxds) 44 is set to 0 V. In operation, the p15 channel transistor 38 and the low-threshold n-channel transistor 36 of each wordline selector circuit 30 constitutes a CMOS transfer gate that passes the output voltage of the vertical x-decoder 22 to the selected wordline 34. As known in the art, in flash memory devices, the program operation deposits electrons on the flash memory cell's floating gate. In the present preferred embodiment of the invention, the above-referenced programming operation is a form of channel hot electron (CHE) injection programming.

In the erase mode, all of the wordlines 34 in a respective sector 12 are erased at the same time. In the preferred embodiment, the second voltage mode (Vxds) 44 is set to −8.7 V during the erase mode. In addition, the first global wordline output 24 and the second global wordline output 26 are set to 0 V by the global x-decoder 18. The vertical wordline outputs $Vwl_o$–$Vwl_n$ 32 of the vertical x-decoder 22 are all set to –8.7 V during the erase operation. As known in the art, in flash memory devices, the erase operation removes electrons from the floating gates of the flash transistors. In the present preferred embodiment, negative gate erase (NGE) is used to remove electrons from the floating gate of the flash transistors.

As set forth above, the present invention discloses a method of selecting a predetermined wordline 34 in a sector 12 of the flash memory 10. In the preferred embodiment, a plurality of pre-decoded address signals are provided to at least one global x-decoder 18 with a plurality of pre-decoded address lines 16. If the pre-decoded address signals correspond to a particular sector 12 that is controlled by the global x-decoder 18, a plurality of wordlines 34 are enabled with a selected sub x-decoder 20 that is electrically connected with the global x-decoder 18. A predetermined wordline 34 is then selected from the plurality of enabled wordlines 34 with a vertical x-decoder 22 that is electrically connected with the global x-decoder 18 and the sub x-decoder 20.

Figure 4:
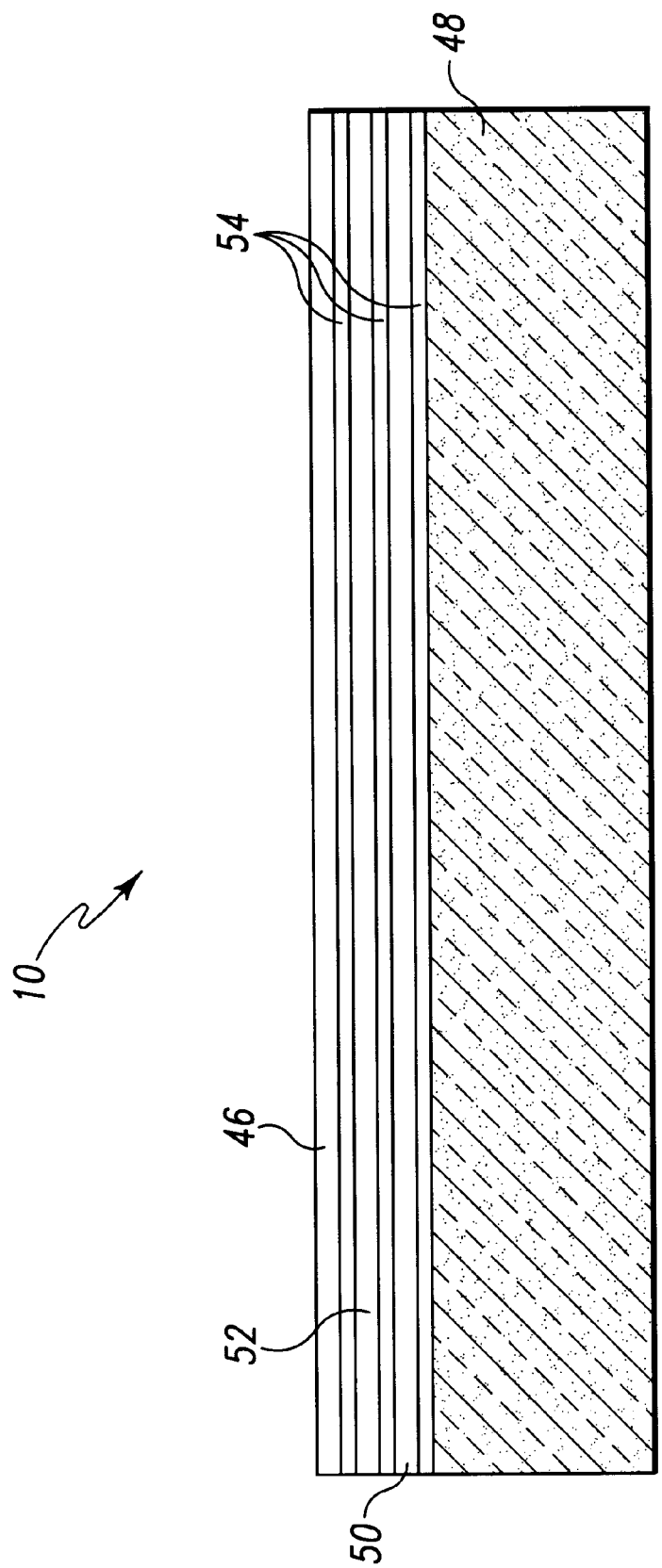
FIG. 4 illustrates a substrate with three layers of metal that are used for metallization.

Referring to FIG. 4, in the preferred embodiment of the present invention, the first global wordline output 24 and the second global wordline output 26 are deposited as a third metal layer 46 on the flash memory 10. As known in the art, one or more layers of conducting metal are deposited on a substrate 48 to interconnect the circuit components of the device with one another. This process is often referred to as metallization in the semiconductor industry. In the present invention, a first metal layer 50 and a second metal layer 52 are used to interconnect the other electrical components of the flash memory 10. As known in the art, a dielectric layer 54 is typically deposited between the metal layers to separate the various metal lines contained in each metal layer from each other on the substrate 48. The third metal layer 46 is used to interconnect the first global wordline output 24 and the second global wordline output 26 of the global x-decoder 18 with each respective sub x-decoder 20 in the flash memory 10.

Presently known prior art memory decoding architectures use first and second metal layers 50, 52 to interconnect the electrical components of the memory device. Since the present invention uses the first global wordline outputs 24 and the second global wordline outputs 26 to partially decode the information that is sent to the sub x-decoders 20, it is only necessary to have two metal lines for each group of 16 wordlines 34. This allows the third metal layer 46 in the core area of the flash memory 10, which consists of the global wordline outputs 24 and the second global wordline outputs 26, to be widely spaced apart, at least six $\mu$m in the preferred embodiment, relative to prior art methods that require a metal line for every wordline in each sector.

Adding the third metal layer 46 to the memory core array results in no penalty in terms of yield loss due to metal shorts that could occur during manufacturing. In prior art memory devices, the metal lines that are used to connect the wordline decoder with each wordline in a sector 12 are spaced approximately 0.7 $\mu$m apart. As readily apparent to those skilled in the art, from a manufacturing standpoint, this provides benefits by not increasing yield losses that occur because of shorts in the metal lines. Those skilled in the art would also recognize that, as the size of the various components that are used in the flash memory 10 decrease, the spacing of the metal lines used in the third metal layer will also decrease as well.

While the invention has been described in its currently best known modes of operation and embodiments, other modes and embodiments of the invention will be apparent to those skilled in the art and it is the following claims, including all equivalents, that are intended to define the spirit and scope of the invention.

What is claimed is:

1. A memory wordline decoder for a memory sector, comprising:

at least one global x-decoder electrically connected with a plurality of predecoded address lines;

at least one sub x-decoder electrically connected with said global x-decoder, wherein said global x-decoder selectively controls said sub x-decoder to enable a plurality of wordlines in said memory sector responsive to signals received from said plurality of pre-decoded address lines; and a vertical x-decoder electrically connected with said global x-decoder and said sub x-decoder, wherein said vertical x-decoder is used to select a predetermined wordline in said memory sector.

2. The memory wordline decoder of claim 1, wherein said electrical connection between said global x-decoder and said sub x-decoder comprises at least one global wordline output and at least one second global wordline output.

3. The memory wordline decoder of claim 2, further comprising respective first and second interconnect layers electrically connecting said global x-decoder with said vertical x-decoder, said vertical x-decoder with said sub x-decoder, and said sub x-decoder with said memory sector, respectively; said memory wordline decoder further comprising a third metal interconnect layer, said third metal interconnect layer comprising said global wordline output and said second global wordline output.

4. The memory wordline decoder of claim 2, wherein said global wordline outputs and said second global wordline outputs are spaced at least 6 $\mu$m apart from one another.

5. The memory wordline decoder of claim 1, wherein said sub x-decoder includes a plurality of wordline selector circuits that are each electrically connected with a respective wordline in said memory sector.

6. The wordline decoder of claim 5, wherein said wordline selector circuit includes a low-threshold n-channel transistor, a p-channel transistor and an n-channel enhancement transistor.

7. A memory wordline decoder for a memory sector, comprising:

at least one global x-decoder electrically connected with a plurality of predecoded address lines, wherein said global x-decoder includes at least one global wordline output, at least one second global wordline output and a plurality of vertical address outputs;

a sub x-decoder connected with said first global wordline output and said second global wordline output for enabling a plurality of wordlines in said memory sector; and a vertical x-decoder connected with said vertical address outputs and said sub x-decoder for selecting a predetermined wordline in said memory sector.

8. The wordline decoder of claim 7, further comprising respective first and second metal interconnect layers electrically connecting said global x-decoder with said vertical x-decoder, said vertical x-decoder with said sub x-decoder, and said sub x-decoder with said memory sector, respectively; said memory wordline decoder further comprising a third metal interconnect layer, said third metal interconnect layer comprising said global wordline output and said second global wordline output.

9. The wordline decoder of claim 7, wherein said global wordline outputs and said second global wordline outputs are spaced at least 6 μm apart from one another.

10. The wordline decoder of claim 7, wherein said sub x-decoder includes a plurality of wordline selector circuits electrically connected with individual wordlines in said memory sector.

11. The wordline decoder of claim 10, wherein said wordline selector circuits include a low-threshold n-channel transistor, a p-channel transistor and an n-channel enhancement transistor.

12. A method of decoding a predetermined wordline in a sector of a memory device, comprising the steps of:
   providing a plurality of pre-decoded address signals to a global x-decoder, said plurality of pre-decoded address signals corresponding to said predetermined wordline;
   enabling a plurality of wordlines with a sub x-decoder electrically connected with said global x-decoder; and
   selecting a predetermined wordline of said plurality of enabled wordlines with a vertical x-decoder electrically connected with said global x-decoder and said sub x-decoder.

13. The method of claim 12, wherein said global x-decoder is connected with said sub x-decoder with at least one global wordline output and at least one second global wordline output.

14. The method of claim 13, wherein said global wordline outputs and said second global wordline outputs are spaced at least 6 μm apart from one another.

15. The method of claim 13, further comprising the step of depositing a first, second and third metal interconnect layer; wherein said first and second metal interconnect layers connect said global x-decoder with said vertical x-decoder, said vertical x-decoder with said sub x-decoder, and said sub x-decoder with said memory sector, respectively; wherein said third metal interconnect layer comprises said global wordline output and said second global wordline output.

16. The method of claim 12, wherein said sub x-decoder includes at least one wordline selector circuit electrically connected with respective wordlines in said sector.

17. The method of claim 16, wherein said wordline selector circuit includes a low-threshold n-channel transistor, a p-channel transistor and an n-channel enhancement transistor.

* * * * *